United States Patent
Morana et al.

(10) Patent No.: US 7,244,126 B2
(45) Date of Patent: Jul. 17, 2007

(54) ELECTRICAL CONNECTOR HAVING A CIRCUIT BOARD WITH CONTROLLED IMPEDANCE

(75) Inventors: Francis P. Morana, Mechanicsburg, PA (US); Dennis Dupler, York Haven, PA (US); Charles Adams, Harrisburg, PA (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 11/298,998

(22) Filed: Dec. 9, 2005

(65) Prior Publication Data

US 2007/0134953 A1    Jun. 14, 2007

(51) Int. Cl.
*H01R 12/00* (2006.01)
*H05K 1/00* (2006.01)
(52) U.S. Cl. ............................ 439/76.1; 439/941
(58) Field of Classification Search ............. 439/76.1, 439/941, 333, 361, 59
See application file for complete search history.

(56) References Cited

U.S. PATENT DOCUMENTS

| | | | | |
|---|---|---|---|---|
| 2,268,813 A | * | 1/1942 | Foster | 455/402 |
| 4,889,497 A | * | 12/1989 | Riches | 439/76.1 |
| 4,947,386 A | * | 8/1990 | Preschutti | 370/283 |
| 5,766,027 A | * | 6/1998 | Fogg | 439/76.1 |
| 5,971,812 A | * | 10/1999 | Martin | 439/676 |
| 6,113,400 A | * | 9/2000 | Martin et al. | 439/76.1 |
| 6,234,807 B1 | | 5/2001 | Amini et al. | |
| 6,425,766 B1 | | 7/2002 | Panella | |
| 6,431,887 B1 | * | 8/2002 | Yeomans et al. | 439/108 |
| 6,612,859 B2 | * | 9/2003 | Yeomans et al. | 439/354 |
| 6,617,939 B1 | | 9/2003 | Vermeersch | |
| 6,682,368 B2 | * | 1/2004 | Murr et al. | 439/607 |
| 6,765,298 B2 | | 7/2004 | Chin et al. | |
| 6,893,270 B2 | * | 5/2005 | Sercu | 439/76.1 |
| 7,131,862 B2 | * | 11/2006 | Vermeersch | 439/497 |

* cited by examiner

*Primary Examiner*—Tulsidas C. Patel
*Assistant Examiner*—Vladimir Imas (57) ABSTRACT

An electrical connector comprises a housing holding a circuit board. The circuit board has a top surface which includes a first region and a second region. Circuit traces are formed on the top surface and extend in the first and second regions. A first ground plane is disposed at a first depth in the circuit board below the circuit traces in the first region. The first depth is selected to provide a specific characteristic impedance of the circuit traces in the first region. A second ground plane is disposed at a second depth in the circuit board below the circuit traces in the second region. The second depth is selected to provide a specific characteristic impedance of the circuit traces in the second region.

23 Claims, 9 Drawing Sheets

ELECTRICAL CONNECTOR HAVING A
CIRCUIT BOARD WITH CONTROLLED
IMPEDANCE

BACKGROUND OF THE INVENTION

This invention relates generally to electrical connectors for transmitting electrical signals, and more particularly, to controlling the impedance within the circuit board held in the electrical connector.

Electrical connectors are used for transferring signals, power, ground and the like, and may comprise a circuit board held within a connector. A cable end of the circuit board has solder pads to which solid wire conductors within a cable are soldered. A separable interface end of the circuit board has contact pads and is configured to extend into a housing that is attached to a motherboard or other device. The contact pads mate to spring contacts or other separable contacts within the housing. Circuit traces are formed on a surface of the circuit board to convey signals. The circuit traces extend across a central portion and into the cable and separable interface ends.

Traditionally, a single ground plane is provided in the circuit board. Characteristic impedance is calculated based on the circuit trace dimensions in the central portion. The distance between the surface and the ground plane in the circuit board is determined to satisfy impedance requirements of the circuit traces within the central portion. The cable and separable interface ends, however, may have different geometry, such as additional circuit traces, compared to the central portion and thus have different impedance. Also, when wire conductors are soldered to the solder pads of the cable end, the impedance is further changed. Therefore, while the impedance below the central portion is controlled, the impedance throughout the circuit board is not uniform.

Signal loss increases when an unbalanced or asymmetric ground environment is created within the circuit board. When transmitting at high speeds, various signal characteristics are negatively impacted, such as increasing EM interference, increasing differential insertion loss, increasing jitter, creating mismatch in the AC return path, introducing common mode energy, creating an unbalanced or common mode signal, and the like. The reduction in signal performance becomes quite noticeable at higher data rates, such as over 4 Gbps.

Therefore, a need exists to control ground impedance of a circuit board within an electrical connector that experiences changes in geometry on one or more surfaces. Certain embodiments of the present invention are intended to meet these needs and other objectives that will become apparent from the description and drawings set forth below.

BRIEF DESCRIPTION OF THE INVENTION

In one embodiment, an electrical connector comprises a housing that holds a circuit board. The circuit board has a top surface including a first region and a second region. Circuit traces on the top surface extend in the first and second regions. A first ground plane is disposed at a first depth in the circuit board below the circuit traces in the first region. The first depth is selected to provide a specific characteristic impedance of the circuit traces in the first region. A second ground plane is disposed at a second depth in the circuit board below the circuit traces in the second region. The second depth is selected to provide a specific characteristic impedance of the circuit traces in the second region.

In another embodiment, a circuit board comprises a top surface including a first region and a second region. Circuit traces are formed on the top surface and extend in the first and second regions. A first ground plane is disposed at a first depth in the circuit board below the circuit traces in the first region. The first depth is selected to provide a specific characteristic impedance of the circuit traces in the first region. A second ground plane is disposed at a second depth in the circuit board below the circuit traces in the second region. The second depth is selected to provide a specific characteristic impedance of the circuit traces in the second region.

In another embodiment, a circuit board comprises a top surface having first and second regions. Circuit traces are formed on the top surface and extend in the first and second regions. A first ground plane is disposed in the circuit board below the circuit traces in the first region at a first depth. The first ground plane controls a characteristic impedance of the circuit traces in the first region based on at least one of surface area of the circuit traces within the first region and dielectric constant of material disposed between the top surface and the first ground plane. A second ground plane is disposed in the circuit board below the circuit traces in the second region at a second depth. The second ground plane controls a characteristic impedance of the second region based on at least one of surface area of the circuit traces within the second region and dielectric constant of material disposed between the top surface and the second ground plane.

The foregoing summary, as well as the following detailed description of certain embodiments of the present invention, will be better understood when read in conjunction with the appended drawings. It should be understood that the present invention is not limited to the arrangements and instrumentality shown in the attached drawings.

DETAILED DESCRIPTION OF THE INVENTION

Figure 1:
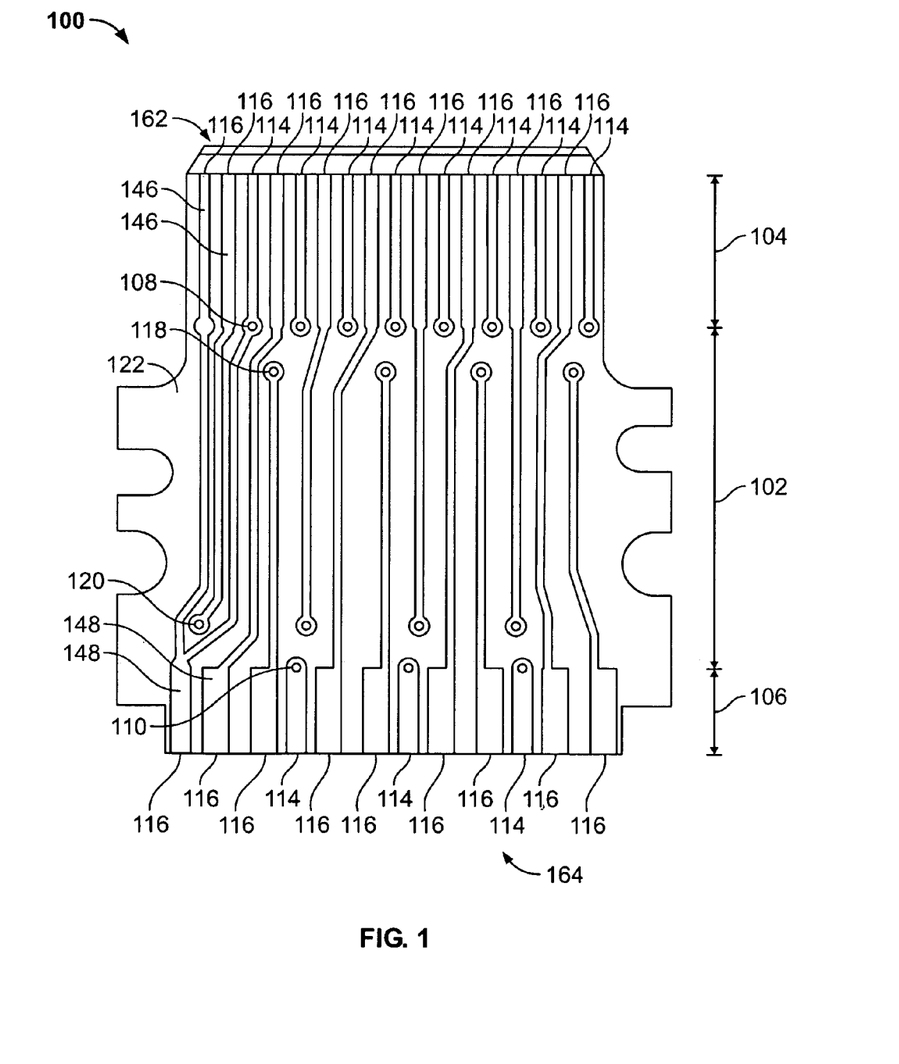
FIG. 1 illustrates a top surface of a double-sided circuit board in accordance with an embodiment of the present invention.

FIG. 1 illustrates a top surface 122 of a double-sided circuit board 100 in accordance with an embodiment of the present invention. Circuit traces are formed on the top surface 122 to convey electrical signals, grounds, power, and the like. The circuit traces include ground traces 114 and signal traces 116. The ground traces 114 are electrically connected to one or more ground planes provided within the circuit board 100 by way of ground vias 108 and 110 (not all vias are indicated by item numbers). Some of the signal traces 116 are electrically connected to signal traces on a bottom surface (FIG. 2) of the circuit board 100 by way of signal vias 118 and 120 (not all vias are indicated by item numbers). It should be understood that other signal implementations may be used, such as different numbers of total circuit traces, signal traces 116, ground traces 114, and traces conveying power. By way of example only, the signal traces 116 may be arranged as pairs for carrying differential signal pairs. The circuit board 100 has a leading edge 162 and a trailing edge 164 and may be used within a plug assembly (FIG. 3).

The top surface 122 may be divided into more than one logical area, section or region. A first region 102 may be a trace area comprising signal traces 116 within a central area of the top surface 122. Previously, a single ground plane was provided in the circuit board 100 to control impedance based on circuit traces within the first region 102. A second region 104 proximate the leading edge 162 may be a separable interface area having contact pads 146 for receiving spring contacts held within an insulated housing (not shown). A third region 106 proximate the trailing edge 164 may be a solder pad area having solder pads 148 for receiving wires, connectors and/or devices which may be soldered thereto. The terms contact and solder pads 146 and 148 are used to refer to the circuit traces within the second and third regions 104 and 106, respectively. It should be understood that more or less regions may be defined based on different specific characteristic impedance requirements of geometries on the top surface 122. The regions may be irregular in shape, and a smaller region may be formed within a larger region.

Figure 2:
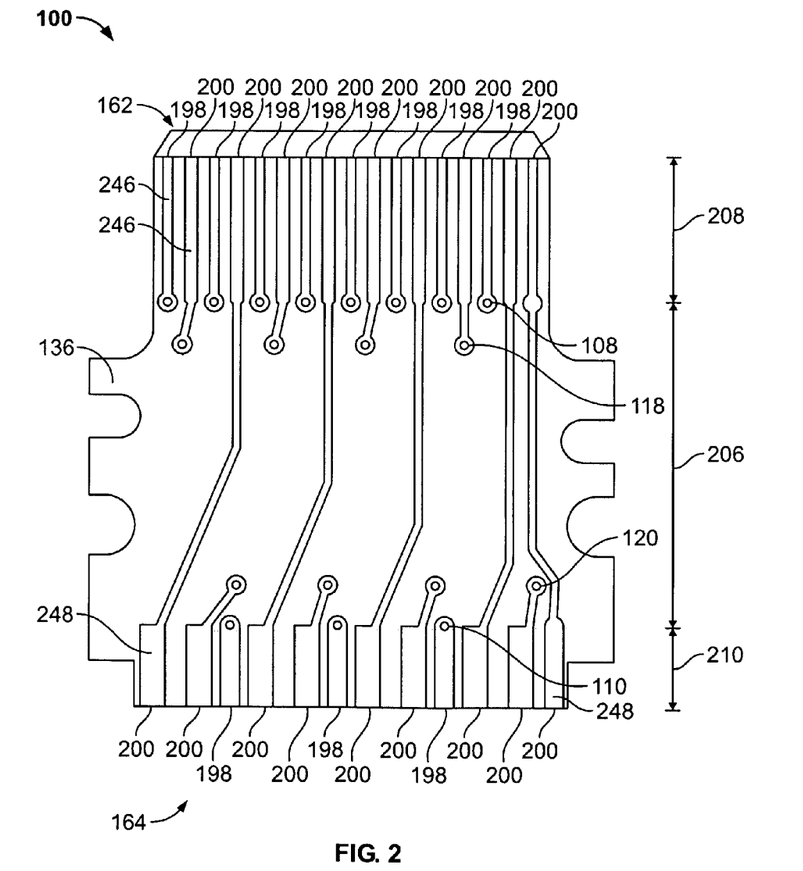
FIG. 2 illustrates a bottom surface of the double-sided circuit board of FIG. 1.
Figure 3:
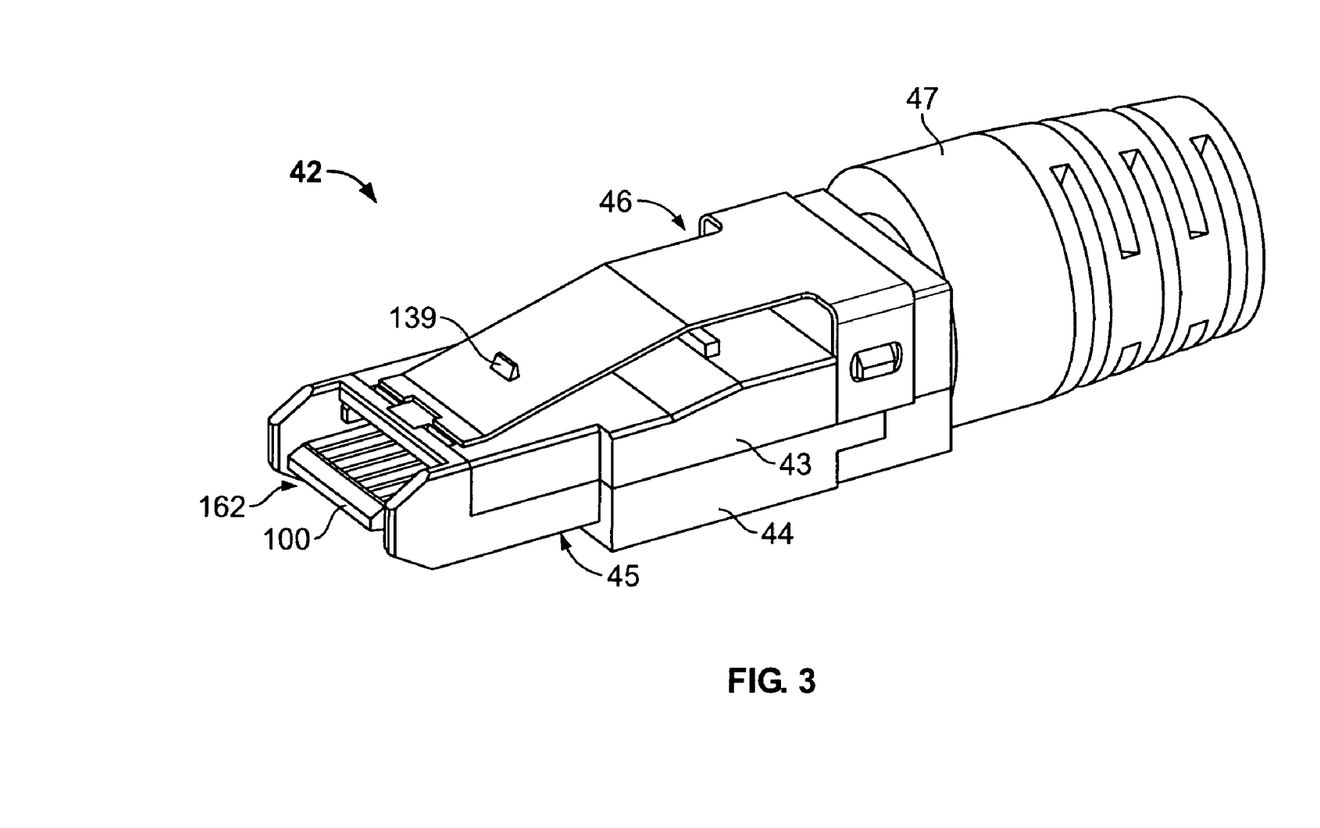
FIG. 3 illustrates an exemplary electrical connector with which a circuit board according to the invention may be used.

FIG. 2 illustrates a bottom surface 136 of the double-sided circuit board 100 of FIG. 1 in accordance with an embodiment of the present invention. Circuit traces are formed on the bottom surface 136 to convey electrical signals, grounds, power, and the like. The circuit traces include ground traces 198 and signal traces 200. The ground traces 198 are connected to one or more ground planes within the circuit board 100 by way of the ground vias 108 and 110 (not all vias are indicated by item numbers). Some of the signal traces 200 are connected to signal traces on the top surface 122 of the circuit board 100 by way of the signal vias 118 and 120 (not all vias are indicated by item numbers).

The bottom surface 136 is logically divided into first bottom region 206, second bottom region 208 and third bottom region 210. The first, second and third bottom regions 206, 208 and 210 may have the same or different dimensions as the first, second and third regions 102, 104 and 106 of the top surface 122. The first bottom region 206 comprises signal traces 200 within a central area of the bottom surface 136. The second bottom region 208 proximate the leading edge 162 has contact pads 246 for receiving spring contacts held within the insulated housing (not shown), and the third bottom region 210 proximate the trailing edge 164 has solder pads 248 for receiving wires, connectors and/or devices which may be soldered thereto.

FIG. 3 illustrates an exemplary electrical connector with which a circuit board 100 according to the invention may be used in accordance with an embodiment of the present invention. The electrical connector may be a plug assembly 42 having an upper shell 43 and a lower shell 44 forming a housing 45 enclosing the circuit board 100. The plug assembly 42 also includes a latch assembly 46 removably mounted to the upper and lower shells 43 and 44. The plug assembly 42 is securely mounted to the end of a cable (not shown) capable of transmitting high speed serial data, such as a quad cable and the like. A strain relief 47 is secured to the back end of the upper and lower shells 43 and 44 to protect the interconnection between the plug assembly 42 and the cable. The latch assembly 46 may include a locking member 139.

At the trailing edge 164 of the circuit board 100, wires within the cable are soldered to the solder pads 148 and 248 on top and bottom surfaces 122 and 136, respectively. Additionally, components and/or devices may also be soldered to the solder pads 148 and 248, such as when the circuit board 100 is used for equalization.

The circuit board 100 is held within the housing 45 such that the leading edge 162 may be inserted into an insulated housing of a mating connector (not shown). The contact pads 146 and 246 frictionally engage spring contacts of the mating connector.

Figure 4:
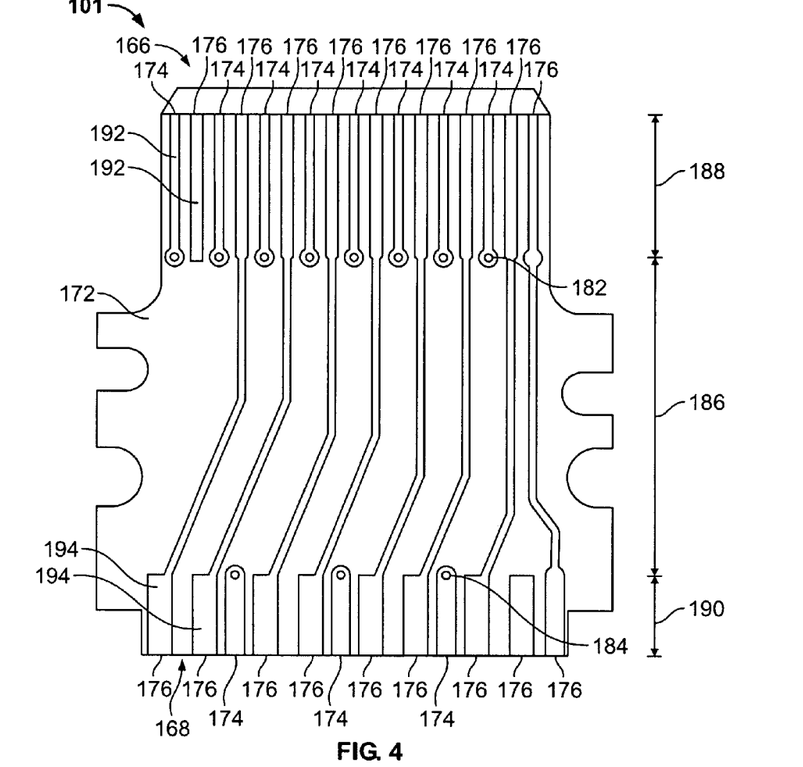
FIG. 4 illustrates a top surface of a single-sided circuit board in accordance with an embodiment of the present invention.

FIG. 4 illustrates a top surface 172 of a single-sided circuit board 101 in accordance with an embodiment of the present invention. Circuit traces are formed on the top surface 172 to convey electrical signals, grounds, power, and the like. No circuit traces, however, are formed on a bottom surface of the circuit board 101. The circuit traces include ground traces 174 and signal traces 176. The ground traces 174 are connected to one or more ground planes within the circuit board 101 by way of ground vias 182 and 184 (not all vias are indicated by item numbers). The circuit board 101 has a leading edge 166 and a trailing edge 168 and may be used within the plug assembly 42 (FIG. 3).

The top surface 172 may be divided into more than one logical area, section or region as described above. A first region 186 comprises signal traces 176 within a central area of the top surface 172. A second region 188 proximate the leading edge 166 has contact pads 192 for receiving spring contacts of the mating connector, and a third region 190 proximate the trailing edge 168 has solder pads 194 for receiving wires, connectors and/or devices which may be soldered to the solder pads 194. It should be understood that more or less regions of different shapes and sizes may be defined based on the impedance requirements of geometries on the top surface 172.

Figure 5:
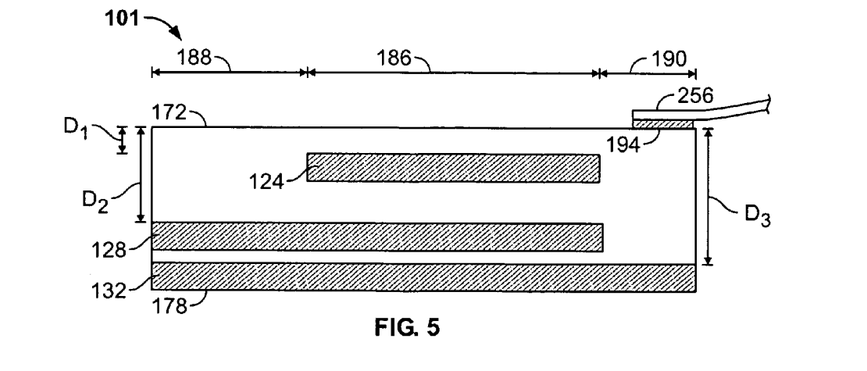
FIG. 5 illustrates multiple ground planes disposed in the single-sided circuit board (FIG. 4) for controlling different regions on the top surface in accordance with an embodiment of the present invention.

FIG. 5 illustrates multiple ground planes disposed in the single-sided circuit board 101 (FIG. 4) for controlling different regions on the top surface 172 in accordance with an embodiment of the present invention. The circuit board 101 may be formed having four layers of conductive material with dielectric material disposed between each of the layers. The first region 186, second region 188 and third region 190 are indicated.

Uniform impedance is desired throughout the different regions on the circuit board 101, such as 50 ohms. Referring to FIG. 4, the geometry or surface area of circuit traces within the first region 186 is different than the surface area of circuit traces within each of the second and third regions 188 and 190. The third region 190 is further changed as wires and/or components are connected to the solder pads 194. Differences in geometry in the first, second and third regions 186, 188 and 190 will result in different specific characteristic impedances for each region. For example, the third region 190 has higher characteristic impedance compared to the first region 186. Therefore, multiple ground planes located different distances with respect to the top surface 172 may be used to separately control the impedance of the first, second and third regions 186, 188 and 190.

A first ground plane 124 is disposed at a depth $D_1$ in the circuit board 101 below the signal traces 176 to control a characteristic impedance of the signal traces 176 in the first region 186. The depth $D_1$ is based on at least one of a surface area of the signal traces 176 within the first region 186 and the dielectric constant of the material used between the first ground plane 124 and the top surface 172.

A second ground plane 128 is disposed at a depth $D_2$ in the circuit board 101 below the contact pads 192 to control a characteristic impedance of the contact pads 192 in the second region 188. The depth $D_2$ is based on at least one of the surface area of the contact pads 192 within the second region 188, and the dielectric constant of the material used between the second ground plane 128 and the top surface 172. The second ground plane 128 extends beneath, but does not impact, the first region 186. Optionally, the second ground plane 128 may be formed to extend only under the second region 188 or under a portion of the first region 186. For example, cost and time savings may be realized by not removing conductive material which does not change impedance, such as the portion of the second ground plane 128 extending below the first region 186. The dielectric material may be varied to achieve a specific characteristic impedance for the circuit traces on the circuit board 101, and therefore, more than one type of dielectric material may be used.

In the third region 190, the solder pads 194 electrically interconnect wires 256 from within the cable attached to the plug assembly 42 (FIG. 3). A third ground plane 132 is disposed at a depth $D_3$ below the solder pads 194 to control a characteristic impedance of the solder pads 194 in the third region 190. The third ground plane 132 may extend beneath the first and second regions 186 and 188 and may form the bottom surface 178 of the circuit board 101. At least one of the surface area of the solder pads 194 and the dielectric constant(s) of the material(s) used between the top surface 172 and the third ground plane 132 are used to determine the depth $D_3$. Therefore, throughout the circuit board 101 the impedance is uniformly controlled by using the first, second and third ground planes 124, 128 and 132 to achieve a specific characteristic impedance of the signal traces 176 in each of the first, second and third regions 186, 188 and 190.

Figure 6:
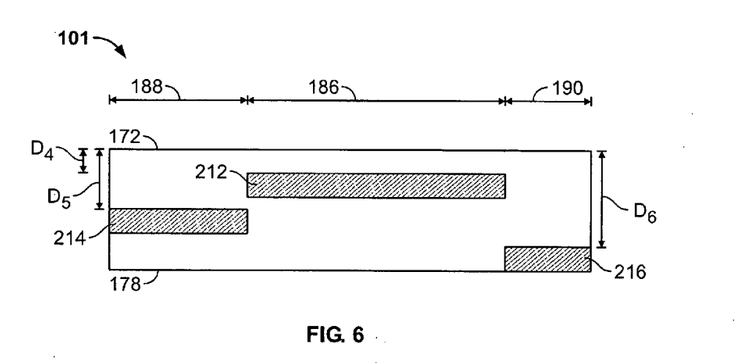
FIG. 6 illustrates an alternative embodiment of multiple ground planes disposed in the single-sided circuit board (FIG. 4) for controlling different regions on the top surface in accordance with an embodiment of the present invention.

FIG. 6 illustrates an alternative embodiment of multiple ground planes disposed in the single-sided circuit board 101 (FIG. 4) for controlling different regions on the top surface 172 in accordance with an embodiment of the present invention. First, second and third ground planes 212, 214 and 216 are disposed below first, second and third regions 186, 188 and 190, respectively. The first ground plane 212, disposed at a depth $D_4$ below the first region 186, does not overlie any portion of the second and third ground planes 214 and 216. The second ground plane 214, disposed at depth $D_5$ below the second region 188, does not overlie any portion of the third ground plane 216, which is disposed at depth $D_6$. It should be noted that other combinations of ground planes within the circuit board 101 may be used.

Figure 7:
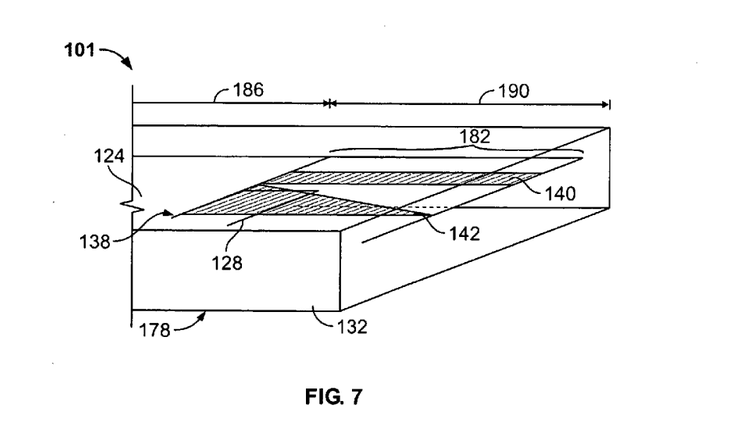
FIG. 7 illustrates an isometric view of an alternative embodiment for controlling impedance within the single-sided circuit board (FIG. 5) in accordance with an embodiment of the present invention.

FIG. 7 illustrates an isometric view of an alternative embodiment for controlling impedance within the single-sided circuit board 101 (FIG. 5) in accordance with an embodiment of the present invention. The first and second ground planes 124 and 128 are disposed in the circuit board 101, while the third ground plane 132 is formed along the bottom surface 178.

As additional layers and/or geometric complexity is added to support additional functionality, higher data rate transmission and the like, there may not be a large enough separation or depth between the ground plane and the surface region to obtain the desired characteristic impedance. Therefore, the impedance within a region may be further controlled by extending a ground plane with an irregularly shaped portion. In FIG. 7, the impedance for the third region 190 may be further controlled by extending the first ground plane 124 with a ground plane extension 182 between the third region 190 and the third ground plane 132. Line 138 indicates a junction between the first and third regions 186 and 190. The ground plane extension 182 forms one or more irregular shapes 140 and 142.

Figure 8:
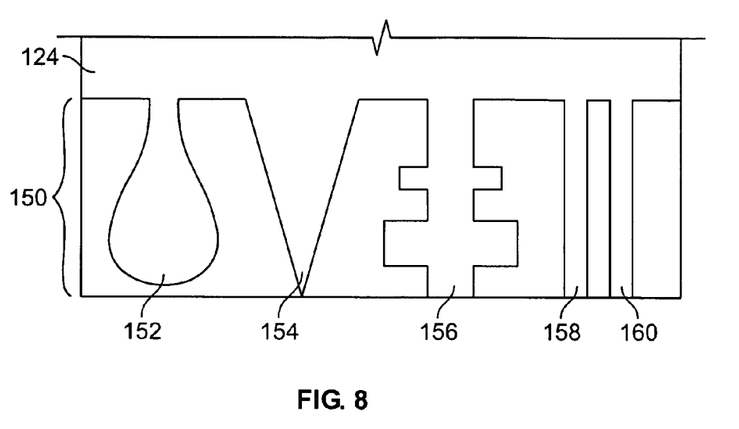
FIG. 8 illustrates exemplary irregular shapes which may be used to form an irregularly shaped portion of a ground plane in accordance with an embodiment of the present invention.

FIG. 8 illustrates exemplary irregular shapes which may be used to form an irregularly shaped portion 150 of a ground plane in accordance with an embodiment of the present invention. The irregularly shaped portion 150 may extend from either the first ground plane 124 (as illustrated in FIG. 7) or the second ground plane 128.

One or more irregular shapes 152–160 extend in the circuit board 101 between the third region 190 and the third ground plane 132, and may be formed by either adding or removing material, such as copper. The size, shape, and/or area of the irregular shapes 152–160 may be varied depending on one or more of the geometry of the third region 190, distances $D_1$, $D_2$ and $D_3$ (FIG. 5), and the dielectric constant of the material used. It should be understood that an irregularly shaped portion may also be used to further control impedance for the second region 188.

Figure 9:
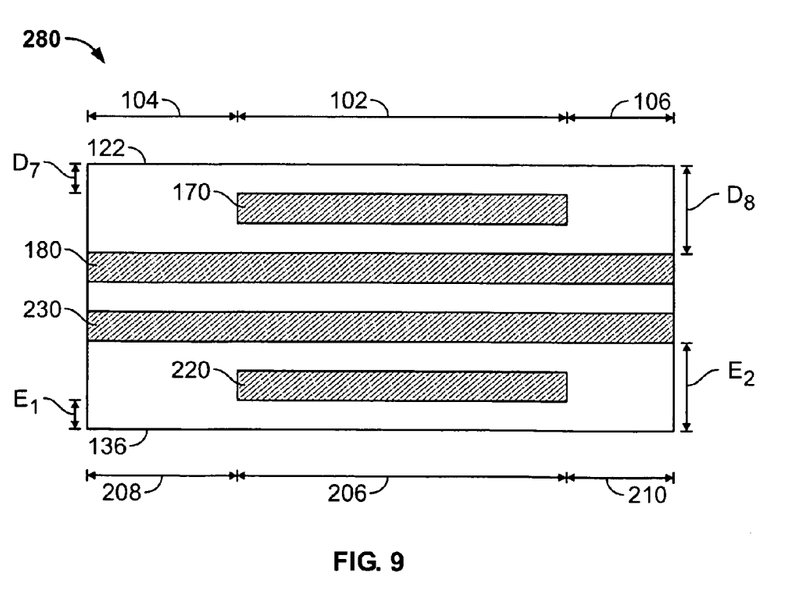
FIG. 9 illustrates a cross-sectional view through a double-sided circuit board (FIGS. 1 and 2) having four ground layers disposed therein in accordance with an embodiment of the present invention.

FIG. 9 illustrates a cross-sectional view through a double-sided circuit board (shown in FIGS. 1 and 2) according to one embodiment of the present invention. In this embodiment, a circuit board 280 has four ground layers disposed therein for controlling impedance of two regions on each of the top and bottom surfaces 122 and 136. The circuit board 280 is formed having six layers of conductive material with dielectric material disposed between each of the layers. The top surface 122 is divided into the first, second and third regions 102, 104 and 106 as previously discussed. First and second ground planes 170 and 180 are formed in the circuit board 280 to control impedance of circuit traces on the top surface 122. The bottom surface 136 has the first, second and third bottom regions 206, 208 and 210 as previously discussed. First and second bottom ground planes 220 and 230 are formed in the circuit board 280 to control impedance of circuit traces on the bottom surface 136.

Figure 10:
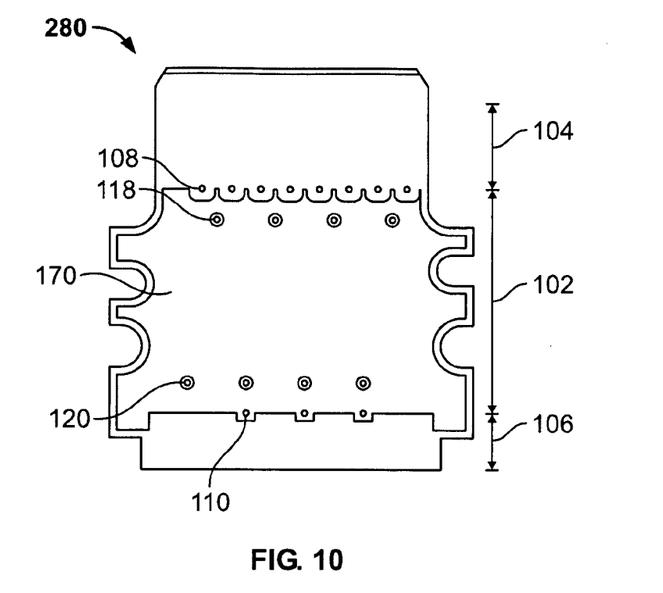
FIG. 10 illustrates a first ground plane disposed in the circuit board of FIG. 9.

FIG. 10 illustrates the first ground plane 170 disposed in the circuit board 280 of FIG. 9 in accordance with an embodiment of the present invention. The first ground plane 170 is disposed at a distance $D_7$ from the top surface 122 and extends below the first region 102. The depth $D_7$ is selected to provide a specific characteristic impedance for the circuit traces within the first region 102.

Figure 11:
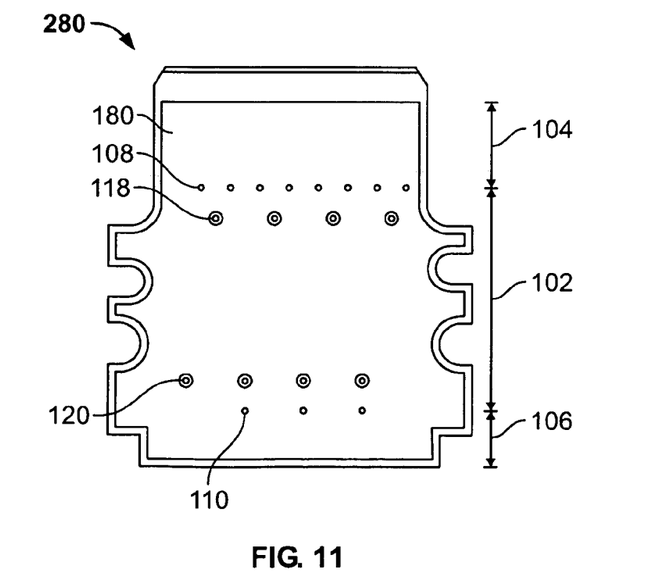
FIG. 11 illustrates a second ground plane disposed in the circuit board of FIG. 9.

FIG. 11 illustrates the second ground plane 180 disposed in the circuit board 280 of FIG. 9 in accordance with an embodiment of the present invention. The second ground plane 180 is disposed at a distance $D_8$ from the top surface 122 and extends below the first, second and third regions 102, 104 and 106. The depth $D_8$ is selected to provide a specific characteristic impedance for the circuit traces, solder pads and/or components within the third region 106. The second ground plane 180 also affects the impedance of the circuit traces in the second region 104, although the depth $D_8$ is not optimized to provide a desired characteristic impedance of the circuit traces in the second region 104. Alternatively, the depth $D_8$ may be selected to provide a specific characteristic impedance for circuit traces within the second region 104.

Figure 12:
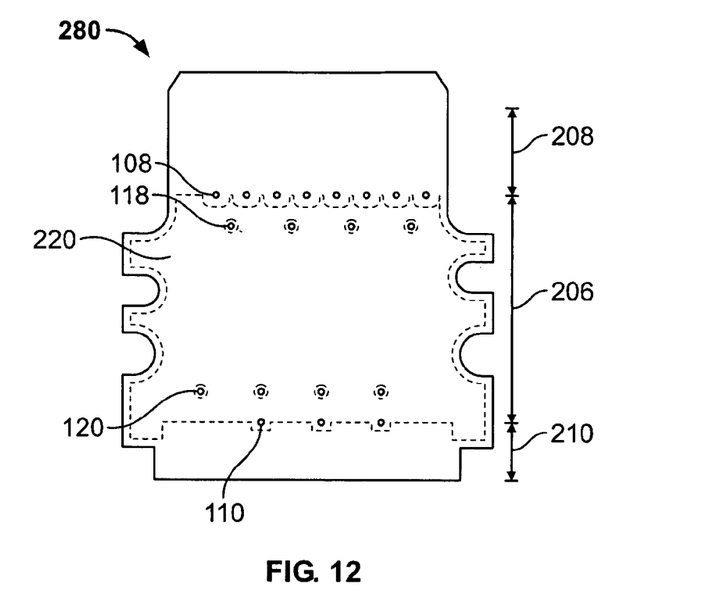
FIG. 12 illustrates a first bottom ground plane disposed in the circuit board of FIG. 9.

FIG. 12 illustrates the first bottom ground plane 220 disposed in the circuit board 280 of FIG. 9 in accordance with an embodiment of the present invention. The first bottom ground plane 220 is disposed at an elevation $E_1$ above the bottom surface 136 and extends above the first bottom region 206. The elevation $E_1$ is selected to provide a specific characteristic impedance for the circuit traces in the first bottom region 206.

Figure 13:
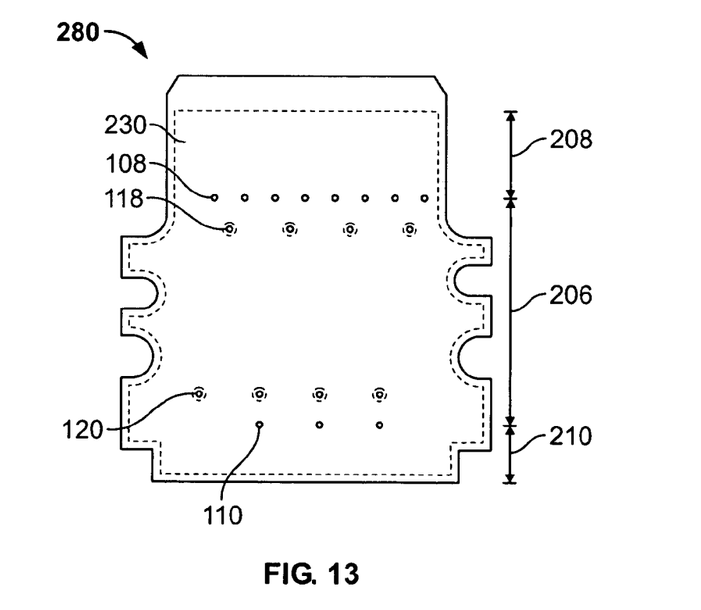
FIG. 13 illustrates a second bottom ground plane disposed in the circuit board of FIG. 9.

FIG. 13 illustrates the second bottom ground plane 230 disposed in the circuit board 280 of FIG. 9 in accordance with an embodiment of the present invention. The second bottom ground plane 230 is disposed at an elevation $E_2$ above the bottom surface 136 and extends above the first, second and third bottom regions 206, 208 and 210. The second ground plane 180 (FIG. 11) and the second bottom ground plane 230 are disposed adjacent one another within the circuit board 280. The second bottom ground plane 230 provides a specific characteristic impedance for the circuit traces, solder pads and/or components within the third bottom region 210. The second bottom ground plane 230 also affects the impedance of the circuit traces in the second bottom region 208.

Figure 14:
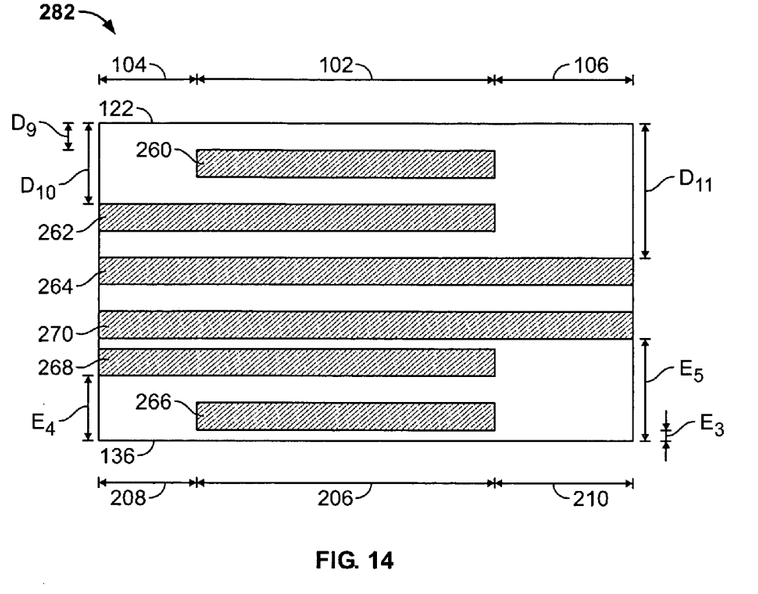
FIG. 14 illustrates a cross-sectional view through a double-sided circuit board (FIGS. 1 and 2) having six ground layers disposed therein in accordance with another embodiment of the present invention.

FIG. 14 illustrates a cross-sectional view through a double-sided circuit board 282 having six ground layers disposed therein in accordance with another embodiment of the present invention. The circuit board 282 is formed having eight layers of conductive material with dielectric material disposed between each of the layers. The top surface 122 has the first, second and third regions 102, 104 and 106, and the bottom surface 136 has the first, second and third bottom regions 206, 208 and 210 as previously discussed. First, second and third ground planes 260, 262 and 264 are disposed at distances $D_9$, $D_{10}$ and $D_{11}$, respectively, from the top surface 122 and provide impedance control for the circuit traces in the first, second and third regions 102, 104 and 106, respectively. First, second and third bottom ground planes 266, 268, and 270 are disposed at elevations $E_3$, $E_4$ and $E_5$, respectively, above the bottom surface 136 to control impedance of the circuit traces in the first, second and third bottom regions 206, 208 and 210, respectively.

Figure 15:
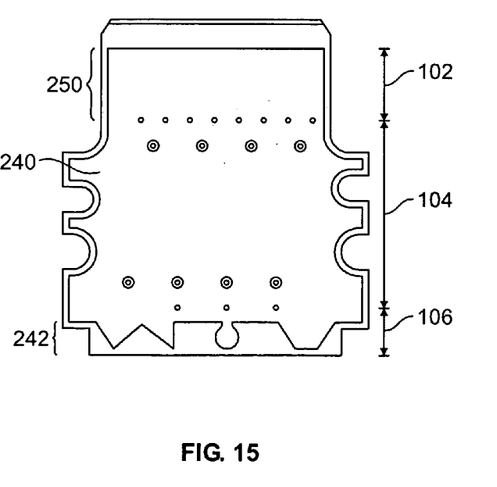
FIG. 15 illustrates an alternative ground plane formed in accordance with an embodiment of the present invention.

FIG. 15 illustrates an alternative ground plane 240 formed in accordance with an embodiment of the present invention. By way of example, the ground plane 240 may replace one of the first ground plane 170 and first bottom ground plane 220 in the circuit board 280 (FIG. 9) to further control the impedance within the third region 106 and third bottom region 210, respectively. The ground plane 240 has an irregularly shaped portion 242 corresponding to the third region 106 or third bottom region 210. Optionally, area 250 may be partially removed to form an additional irregularly shaped portion to further control the impedance of the second region 104 or second bottom region 208.

While the invention has been described in terms of various specific embodiments, those skilled in the art will recognize that the invention can be practiced with modification within the spirit and scope of the claims.

What is claimed is:

1. An electrical connector comprising:
a housing that holds a circuit board, the circuit board having a top surface including a first region and a second region, circuit traces on the top surface extending in the first region and the second region, a first ground plane in the circuit board, the first ground plane disposed below the circuit traces in the first region at a first depth and a second ground plane in the circuit board, the second ground plane disposed below the circuit traces in the second region at a different second depth wherein the first ground plane is not disposed below at least a portion of the circuit traces in the second region that overlie the second ground plane.

2. The electrical connector of claim 1, wherein the characteristic impedance of the circuit traces in the first region is substantially equal to the characteristic impedance of the circuit traces in the second region.

3. An electrical connector comprising:
a housing that holds a circuit board, the circuit board having a top surface including a first region and a second region, circuit traces on the top surface extending in the first region and the second region, a first ground plane in the circuit board, the first ground plane disposed below the circuit traces in the first region at a first depth, and a second ground plane in the circuit board, the second ground plane disposed below the circuit traces in the second region at a different second depth wherein the first ground plane does not overlie at least a portion of the second ground plane.

4. The electrical connector of claim 1, wherein the second ground plane includes an irregularly shaped portion that extends below the circuit traces in the second region.

5. The electrical connector of claim 1, wherein the top surface includes a third region, the circuit traces extend in the third region, and a third ground plane in the circuit board is disposed below the circuit traces in the third region at a third depth which is selected to provide a characteristic impedance of the circuit traces in the third region.

6. The electrical connector of claim 1, wherein the circuit board has a bottom surface including a first bottom region and a second bottom region, and circuit traces on the bottom surface extending in the first and the second bottom regions, wherein a first bottom ground plane is disposed in the circuit board at a first elevation above the circuit traces in the first bottom region, the first elevation is selected to provide a characteristic impedance of the circuit traces in the first bottom region, a second bottom ground plane is disposed in the circuit board at a second elevation above the circuit traces in the second bottom region, and the second elevation is selected to provide a characteristic impedance of the circuit traces in the second bottom region.

7. A circuit board comprising:
a top surface including a first region and a second region;
circuit traces formed on the top surface and extending in the first region and the second region;

a first ground plane in the circuit board, the first ground plane disposed below the circuit traces in the first region at a first depth; and a second ground plane in the circuit board, the second ground plane disposed below the circuit traces in the second region at a different second depth, wherein the first ground plane does not overlie at least a portion of the second around plane.

8. The circuit board of claim 7, further comprising:

the top surface further including a third region, the circuit traces extending in the third region; and the second ground plane further including an irregularly shaped portion extending below the circuit traces in the third region.

9. The circuit board of claim 7, further comprising:

the top surface further comprising a third region, the circuit traces extending in the third region; and a third ground plane in the circuit board disposed below the circuit traces in the third region at a third depth.

10. The circuit board of claim 7, further comprising:

a bottom surface formed opposite the top surface, the bottom surface including first and second bottom regions;

circuit traces formed on the bottom surface extending in the first and the second bottom regions;

a first bottom ground plane disposed in the circuit board at a first elevation above the circuit traces in the first bottom region; and a second bottom ground plane disposed in the circuit board at a second elevation above the circuit traces in the second bottom region.

11. The circuit board of claim 7, further comprising:

a bottom surface formed opposite the top surface, the bottom surface including first, second and third bottom regions;

circuit traces on the bottom surface extending in the first, second and third bottom regions;

a first bottom ground plane disposed in the circuit board at a first elevation above the circuit traces in the first bottom region, the first elevation being selected to provide a characteristic impedance of the circuit traces in the first bottom region;

a second bottom ground plane disposed in the circuit board at a second elevation above the circuit traces in the second bottom region, the second elevation being selected to provide a characteristic impedance of the circuit traces in the second bottom region; and a third bottom ground plane disposed in the circuit board at a third elevation above the circuit traces in the third bottom region, the third elevation being selected to provide a characteristic impedance of the circuit traces in the third bottom region.

12. The circuit board of claim 7, wherein the characteristic impedance of the circuit traces in the first region is substantially equal to the characteristic impedance of the circuit traces in the second region.

13. A circuit board comprising:

a top surface having first and second regions;

circuit traces formed on the top surface and extending in the first and second regions;

a first ground plane disposed in the circuit board below the circuit traces in the first region at a first depth, the first ground plane controlling a characteristic impedance of the circuit traces in the first region based on at least one of surface area of the circuit traces within the first region and dielectric constant of material disposed between the top surface and the first ground plane; and a second ground plane disposed in the circuit board below the circuit traces in the second region at a different second depth, the first and second depths being different the second ground plane controlling a characteristic impedance of the circuit traces in the second region based on at least one of surface area of the circuit traces within the second region and dielectric constant of material disposed between the top surface and the second ground plane, wherein the first and second ground planes have at least one of different shapes, sizes and areas.

14. The circuit board of claim 13, the top surface further comprising a third region, the circuit traces extending in the third region, the second ground plane extending below the third region and further controlling a characteristic impedance of the circuit traces within the third region.

15. The circuit board of claim 13, further comprising:

the top surface further comprising a third region, the circuit traces extending in the third region; and the first ground plane further comprising an irregularly shaped portion extending below the circuit traces in the third region, the first and second ground planes controlling a characteristic impedance of the circuit traces within the third region.

16. The circuit board of claim 13, further comprising:

a bottom surface having circuit traces; and a bottom ground plane in the circuit board, the bottom ground plane disposed above the circuit traces at an elevation which is selected to provide a characteristic impedance of the circuit traces within a region on the bottom surface.

17. The circuit board of claim 13, further comprising:

a bottom surface having circuit traces, the bottom surface including first and second bottom regions; and first and second bottom ground planes disposed in the circuit board above the circuit traces in the first and second regions at first and second elevations, respectively, the first elevation selected to provide a characteristic impedance of the circuit traces within the first bottom region and the second elevation selected to provide a characteristic impedance of the circuit traces within the second bottom region.

18. The circuit board of claim 13, wherein the characteristic impedance of the circuit traces in the first region is substantially equal to the characteristic impedance of the circuit traces in the second region.

19. The circuit board of claim 13, wherein the first and second depths are selected to provide uniform impedance throughout the circuit traces on the circuit board.

20. The electrical connector of claim 1, wherein the first and second ground planes have at least one of different shapes, sizes, and areas.

21. The circuit board of claim 7, wherein the first and second ground planes have at least one of different shapes, sizes, and areas.

22. The circuit board of claim 13, wherein the first ground plane is not disposed below at least a portion of the circuit traces in the second region.

23. The circuit board of claim 13, wherein the first and second ground planes are disposed below at least partially different portions of the first and second regions.

* * * * *